US009197232B1

(12) United States Patent
Hamzeh

(10) Patent No.: US 9,197,232 B1
(45) Date of Patent: Nov. 24, 2015

(54) SPECTRALLY WEIGHTED ANALOG TO DIGITAL CONVERSION

(71) Applicant: Cable Television Laboratories, Inc., Louisville, CO (US)

(72) Inventor: Belal Hamzeh, Westminster, CO (US)

(73) Assignee: CABLE TELEVISION LABORATORIES, INC., Louisville, CO (US)

( * ) Notice: Subject to any disclaimer, the term of this patent is extended or adjusted under 35 U.S.C. 154(b) by 0 days.

(21) Appl. No.: 14/285,026

(22) Filed: May 22, 2014

Related U.S. Application Data

(60) Provisional application No. 61/991,833, filed on May 12, 2014.

(51) Int. Cl.
*H03M 1/00* (2006.01)
*H03M 1/08* (2006.01)
*H03M 1/12* (2006.01)

(52) U.S. Cl.
CPC ............ *H03M 1/0854* (2013.01); *H03M 1/122* (2013.01)

(58) Field of Classification Search
CPC ..... H03M 1/0854; H03M 1/122; H03M 3/50; H03M 1/747; H03M 3/30; H03M 3/358; H03M 3/436; H03M 3/502; H03M 7/3026; H03M 7/3033; H03M 1/12; H03M 3/38; H03M 3/414; H03M 3/468; H03M 1/661; H03M 3/396; H03M 3/412
USPC .................................. 341/143, 144, 155, 141
See application file for complete search history.

(56) References Cited

U.S. PATENT DOCUMENTS 6,021,386 A * 2/2000 Davis .................... G10L 19/008 704/229
6,864,818 B1 * 3/2005 Hezar ........................... 341/143
8,294,605 B1 * 10/2012 Pagnanelli .................... 341/144

* cited by examiner

*Primary Examiner* — Jean B Jeanglaude
(74) *Attorney, Agent, or Firm* — Duft Bornsen & Fettig; Gregory T. Fettig

(57) ABSTRACT

Systems and methods presented herein provide for analog to digital conversion with variable bit resolution. In one embodiment, a system includes a processor and a multiplexer. The processor is operable to receive an analog signal, to detect power spectral densities in the analog signal, to segment the analog signal into at least two frequency bands, to sample each of the frequency bands, and to quantize each of the sampled frequency bands with bit resolutions according to detected power spectral densities of the frequency bands. The multiplexer is operable to multiplex the quantized frequency bands into a data stream.

20 Claims, 7 Drawing Sheets

SPECTRALLY WEIGHTED ANALOG TO DIGITAL CONVERSION

BACKGROUND

Digital signal processing (DSP) is the mathematical manipulation of a signal to modify or improve the signal. Generally, a continuous time analog signal is first converted to a discrete time digital representation of the signal via the widely known process of analog to digital (A/D) conversion. While DSP and A/D are well known concepts that are used in many applications, larger bandwidth signals can create problems. For example, a 1 MHz bandwidth signal generally requires a 2 MHz sampling rate to avoid aliasing. Each sample is represented digitally by some number of bits. With more bits comes better resolution and better signal-to-noise ratio (SNR) over quantization noise. So, if each sample in the 2 MHz sampling rate was represented by 8 bits, the bit rate of the sampled signal would 16 Megabits per second (Mbps). This bit rate is easily obtained with current state of the art processing. But, if the signal is a 100 MHz active Radio Frequency (RF) signal and the resolution is 16 bits, then the bit rate of the signal is 3.2 Gigabits per second (Gbps) without even considering the effects of additional data required for error correction in real time processing. These larger bandwidth signals require much faster bit rates that are simply too difficult to process in real time.

SUMMARY

Systems and methods presented herein provide for analog to digital conversion with variable bit resolution. In one embodiment, a system includes a processor and a multiplexer. The processor is operable to receive an analog signal, to detect power spectral densities in the analog signal, to segment the analog signal into at least two frequency bands, to sample each of the frequency bands, and to quantize each of the sampled frequency bands with bit resolutions according to detected power spectral densities of the frequency bands. The multiplexer is operable to multiplex the quantized frequency bands into a data stream.

The various embodiments disclosed herein may be implemented in a variety of ways as a matter of design choice. For example, some embodiments herein are implemented in hardware whereas other embodiments may include processes that are operable to implement and/or operate the hardware. Other exemplary embodiments, including software and firmware, are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
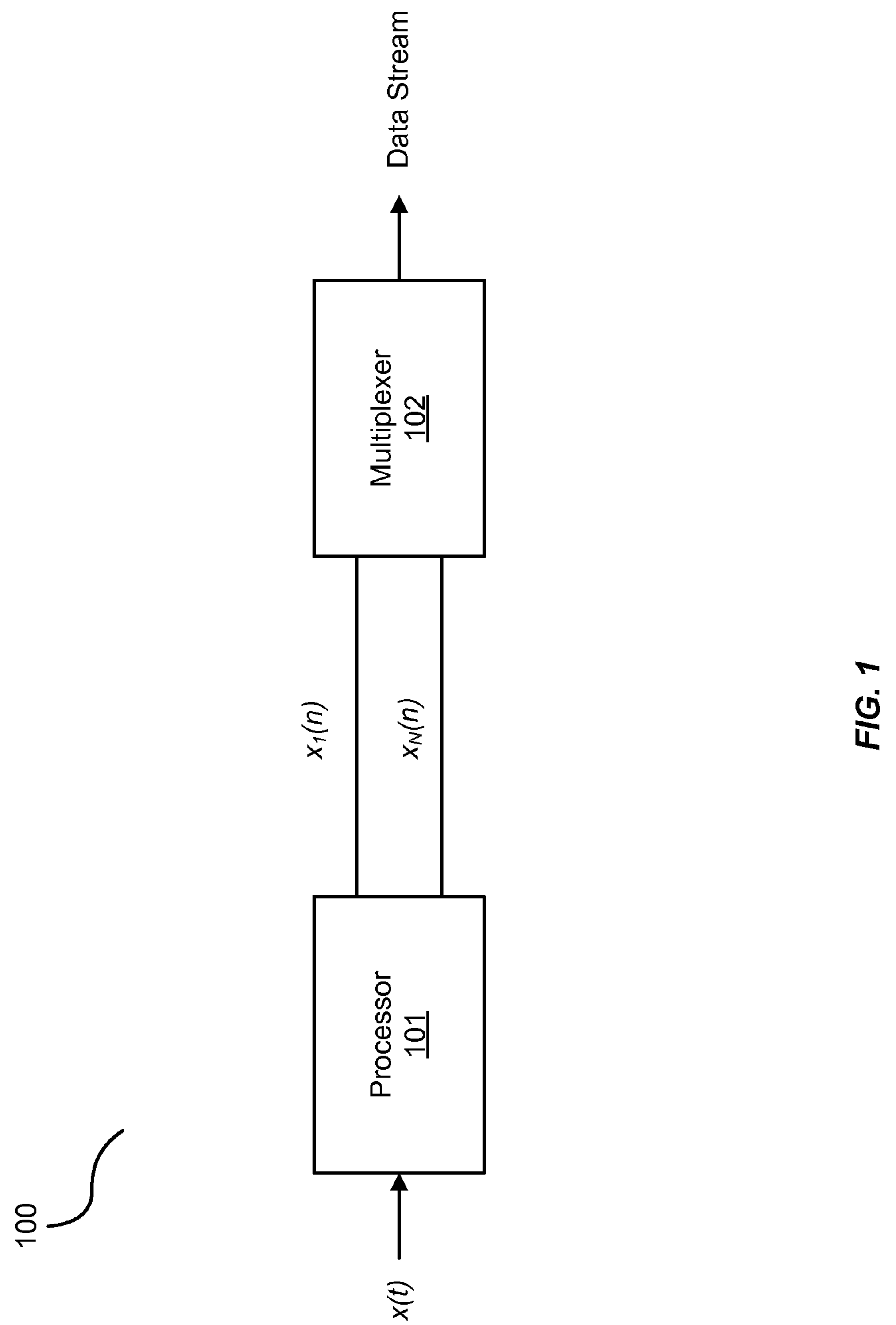
FIG. 1 is a block diagram of an exemplary A/D processing system.

FIG. 1 is a block diagram of an exemplary A/D processing system 100. The processing system 100 includes a processor 101 and a multiplexer 102. The processor 101 is any system, device, software, or combination thereof operable to sample an analog signal x(t), determine power spectral densities across the frequency domain of the analog signal x(t), and assign bit resolutions to frequency sub bands according to those power spectral densities. The processor 101 then outputs a plurality of discrete variable bit rate signals $x_1(n)$-$x_N(n)$ (where "N" is merely intended to represent an integer greater than 1 and not necessarily equal to any other N reference numeral herein) corresponding to the assigned bit resolution/power spectral densities. The multiplexer 102 is any system, device, software, or combination thereof operable to combine the discrete signals $x_1(n)$-$x_N(n)$ from the processor 101 into a data stream. Additional details regarding the A/D processing system 100 are shown and described with respect to the process 200 of FIG. 2.

Figure 2:
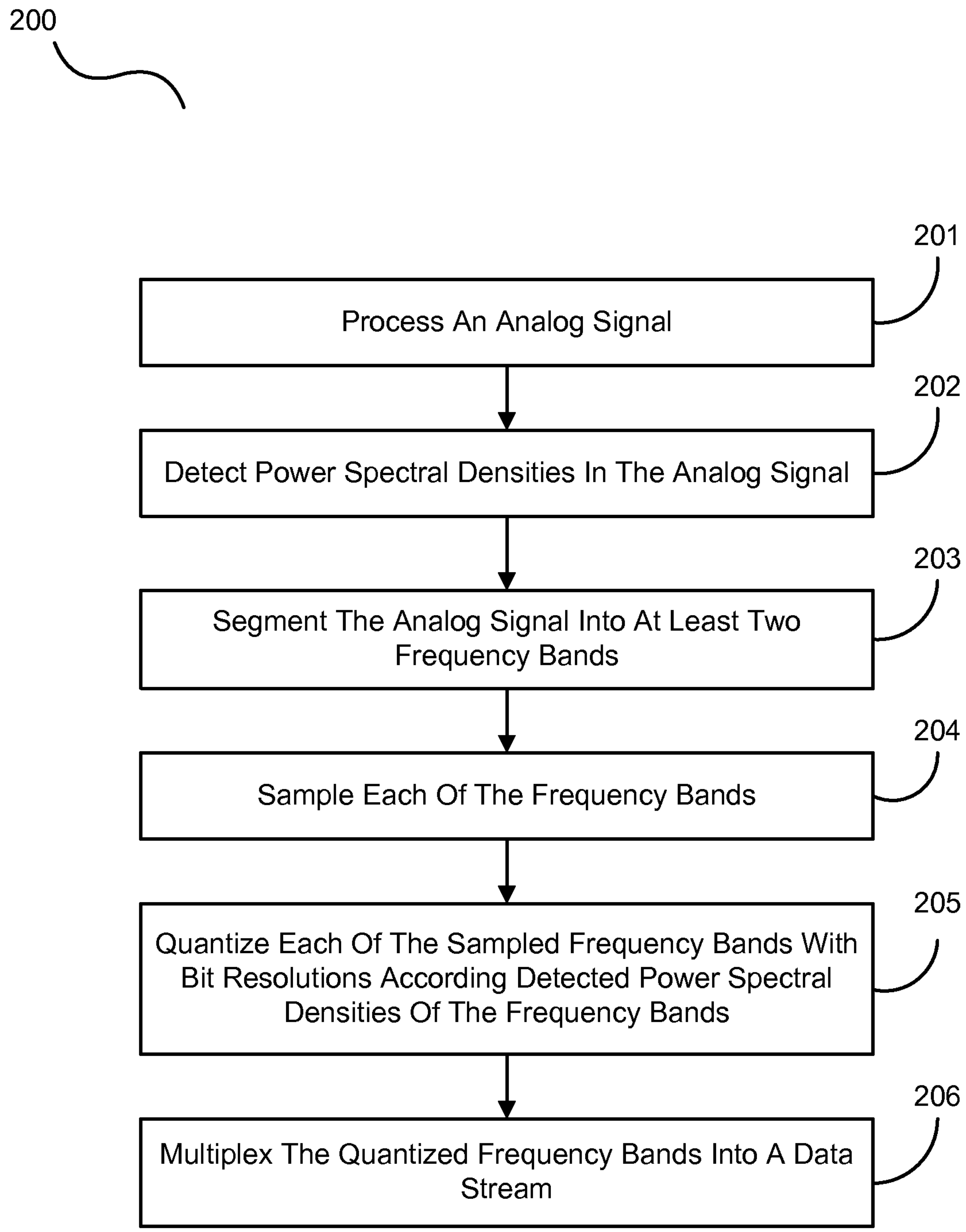
FIG. 2 is a flowchart illustrating an exemplary process of the A/D processing system of FIG. 1.

FIG. 2 is a flowchart illustrating an exemplary process 200 of the A/D processing system 100. The processor 100 receives the analog signal x(t) to initiate processing on the analog signal, in the process element 201. From there, the processor 100 detects power spectral densities in the analog signal x(t), in the process element 202. The processor 100 segments the analog signal x(t) into at least two frequency bands, in the process element 203, and samples those bands, in the process element 204. This generally produces multiple streams of sampled data which the processor 101 quantizes with different bit resolutions. In other words, the processor 101 may quantize each of the sampled frequency bands with bit resolutions according to detected power spectral densities of the frequency bands, in the process element 205, and in doing so, the processor 101 assigns a particular number of bits for each sample of a certain frequency band.

Since there are variable numbers of bits per sample on a frequency band by frequency band basis, there may be different rates among the frequency bands. Accordingly, the multiplexer 102 multiplexes the quantized streams from the processor 101 into a single datastream for real-time processing by a receiving end, in the process element 206.

To illustrate, assume the analog signal has a frequency bandwidth of 20 MHz and that bandwidth is segmented into two 10 MHz frequency bands. Now, assume a common sampling rate of 20 MHz. If one of the two frequency bands is designated with two bits per sample (e.g., because it has a lower power spectral density than the other frequency band), then the bit rate from the processor 101 is about 40 Mbps for the quantized lower spectral density frequency band to process in real time at a receiving end (i.e., assuming no other bits for error correction and the like). And if the other frequency band is designated with four bits per sample, then the bit rate of the processor 101 for that quantized higher spectral density frequency band is about 80 Mbps. Thus, the multiplexer 102 interleaves the two bit streams associated with the two frequency bands into a single datastream of about 120 Mbps such that the entire 20 MHz spectrum of the analog signal can be analyzed/observed in real time at the receiving end.

As one can see from this example, if the entire 20 MHz spectrum of the analog signal was sampled at 40 MHz and a common bit resolution of four bits was applied to each sample, then the total bit rate of the quantized signal would be about 160 Mbps to process in real time. Accordingly, the embodiments herein provide a selective quantization/bit resolution based on power spectral density across the frequency spectrum of the analog signal. And, this selective quantization process means that bit rates for real-time processing at a receiving end can be reduced.

Alternatively, more bits can be selectively assigned to certain frequency bands to enhance the signal-to-noise ratio in those bands. For example, if an increase in the SNR on the higher power spectral density frequency band in the above example was desired, more bits could be assigned to the quantization of that frequency band to increase the SNR over the quantization noise. To illustrate, assuming the same scenario above except that the higher power spectral density frequency band is assigned six bits per sample instead of the previous four bits per sample. Then, the bit rate of that frequency band would be about 120 Mbps. When multiplexed with the quantized signal of the lower power spectral density frequency band, the overall bit rate returns to about 160 Mbps. But, the SNR improves significantly in the higher power spectral density band because dB increases proportionally to the number of bits of resolution—by about 6.02 times per bit. The embodiments below provide additional details regarding this process.

Figure 3:
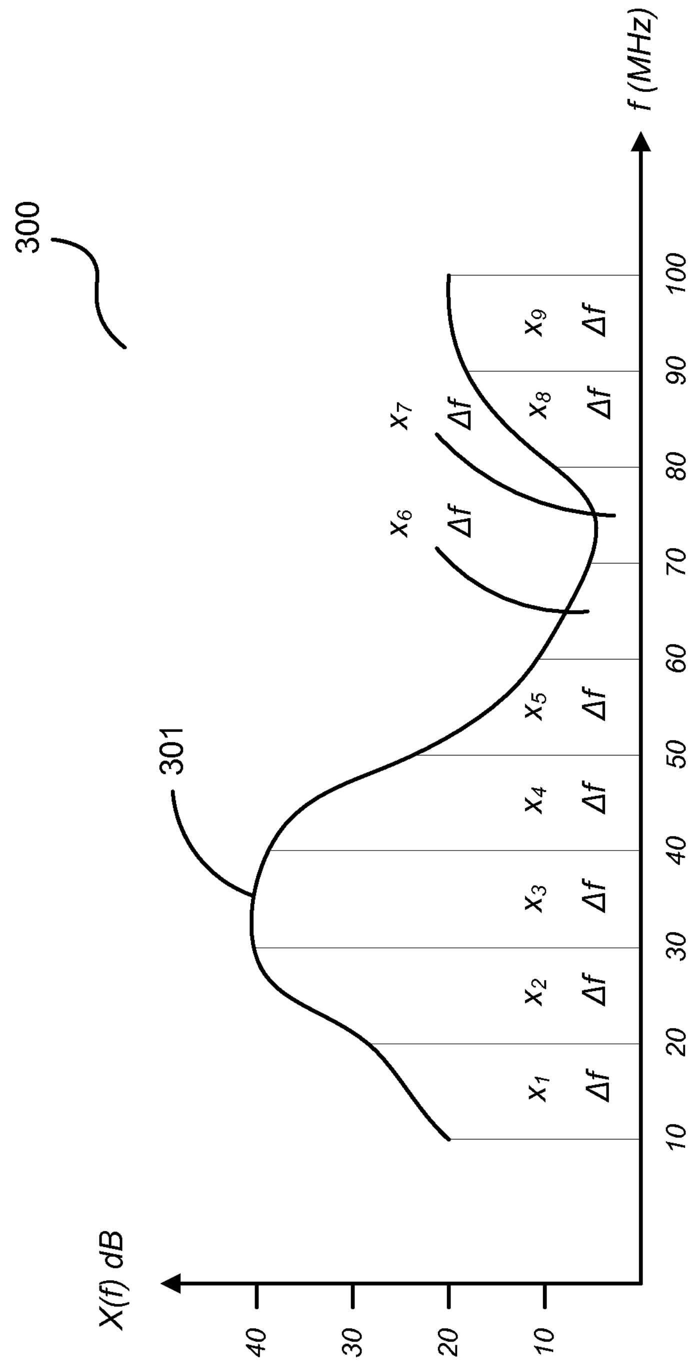
FIG. 3 is a graph of an exemplary frequency domain.
Figure 4:
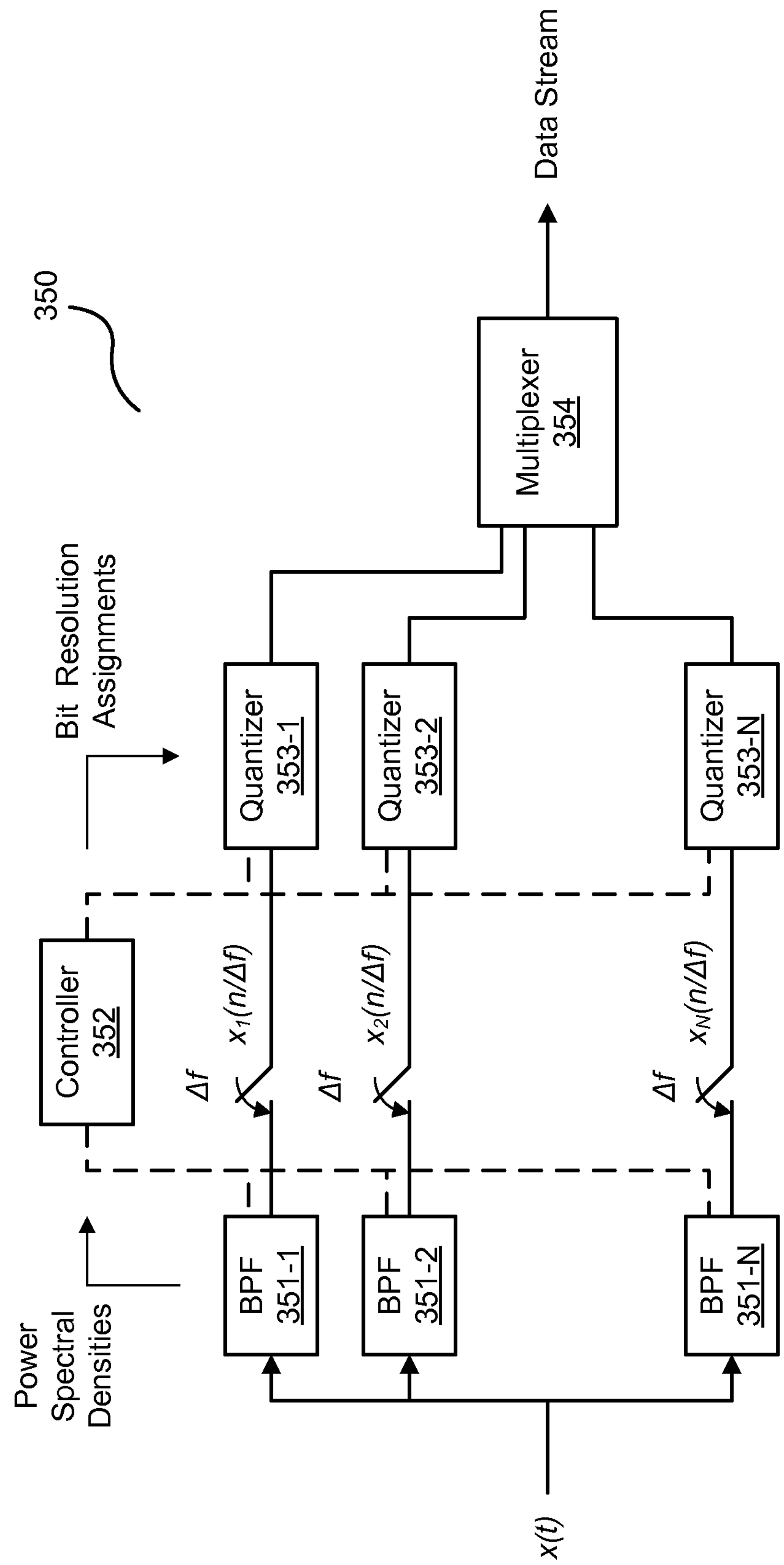
FIG. 4 is a block diagram of another exemplary A/D processing system.

FIG. 3 is a graph of an exemplary frequency domain 300 of an analog signal 301 (e.g., an RF signal). The frequency spectrum of interest of the signal 301, in this example, is from 10 MHz to 100 MHz with the frequency spectrum of the signal 301 being segmented into 10 MHz chunks. FIG. 4 is a block diagram of another exemplary A/D processing system 350. The frequency domain 300 will now be discussed in the context of the A/D processing system 350 processing the analog signal 301.

In this embodiment, the A/D processing system 350 as a plurality of bandpass filters 351-1-351-N. Each bandpass filter 351 is operable to receive the analog signal x(t) and filter out a 10 MHz portion. For example, the band pass filter 351-1 filters around the 10 MHz frequency band $x_1$, the bandpass filter 351-2 filters around the 10 MHz frequency band $x_2$, the bandpass filter 351-3 filters around the 10 MHz frequency band $x_3$, etc. Each of these 10 MHz frequency bands is then sampled at, in this embodiment, a common sampling rate of Δf (e.g., 20 MHz Nyquist), thereby producing a corresponding number of sampled sub-signals $x_1, x_2, \ldots, x_9$.

A controller 352 may determine the power spectral densities of the signals from the bandpass filters 351-1-351-N so as to direct bit resolution assignments to the quantizer 353-1-353-N. For example, any frequency band having an average power spectral density less than 10 dB may receive two bits of resolution, a frequency band having an average power spectral density between 10 and 20 dB may receive three bits of resolution, a frequency band having an average power spectral density between 20 and 30 dB may receive four bits of resolution, and any frequency band having an average power spectral density between 30 and 40 dB may receive five bits of resolution. Thus, for the purposes of this illustration, the controller 352 directs the quantizer 353-1 to assign three bits of resolution to the $x_1$ frequency band signal, five bits of resolution to the $x_2$, $x_3$, and $x_4$ frequency band signals, three bits of resolution to the $x_5$ frequency band signal, two bits of resolution to the $x_6$ and $x_7$ frequency band signals, and three bits of resolution to the $x_8$ and $x_9$ frequency band signals.

After quantization by the quantizer 353-1-353-N, the frequency band signals, or "sub-streams", $x_1$-$x_9$ are now represented by digital streams of varying bit rates. For example, based on the assigned bit resolutions by the controller 352 to the quantizers 353-1-353-N, the $x_1$ frequency band signal is represented by a data stream having a bit rate of 40 Mbps (i.e., due to Δf equaling 20 MHz with 2 bits of resolution, or 20 Mhz times 2). The $x_2$, $x_3$, and $x_4$ frequency band signals are similarly represented by datastreams having bit rates of 100 Mbps, with the $x_5$ frequency band signal having a bit rate of 60 Mbps, the $x_6$ and $x_7$ frequency band signals having bit rates of 40 Mbps, the $x_8$ and $x_9$ frequency band signals having bit rates of 60 Mbps. The multiplexer 354 then combines the sub-streams of each of the frequency bands $x_1$-$x_9$ into a single output datastream having an overall bit rate of 620 Mbps (i.e., 60 Mbps+100 Mbps+100 Mbps+100 Mbps+60 Mbps+40 Mbps+40 Mbps+60 Mbps+60 Mbps), neglecting effects of error correction, quantization errors, and the like.

A more detailed and mathematical discussion of the above is now presented. Nyquist's theorem for alias-free signal sampling states that, for a baseband signal with a maximum frequency $f_m$, the sampling rate is at least $2 \cdot f_m$. And, for a bandpass signal with a bandwidth of B, the sampling rate is an integer multiple of B.

After a signal is sampled at a rate off samples per second, the sampled values are digitized/quantized to discrete levels based on the number of bits per sample b. Thus, the overall bit rate of a sampled signal $r_b$ is given by $r_b = f_s \cdot b$ bits per second. The reconstructed signal integrity, assuming alias-free sampling, is directly related to the quantization error during digitization, which is a function of the number of bits per sample b. The RMS (Root Mean Square) quantization error QE is a function of the least significant bit (LSB) in the bit resolution and is generally given to be $$QE = \left(\frac{1}{\sqrt{12}}\right) \cdot LSB \text{ volts.}$$

The signal x(t) being sampled can be decomposed into multiple sub-signals which when added together form the overall x(t) such as:

$$x(t) = x_0(t) + x_1(t) + \ldots + x_{L-1}(t).$$

Once sampled, that signal becomes:

$x(n) = x_0(n) + x_1(n) + \ldots + x_{L-1}(n)$, which is the sum of the sampling of the sub-signals.

The contributions of the sub-signals to x(t) can be based on various metrics, one of which being the relative sub-signal power. In other words, the sub-signal with the highest relative power is the signal that most contributes to x(t). With this in mind, an alternate way of looking at the signal integrity is that the sub-signals contributing the most to x(t) should be provided a higher degree of fidelity and protection from errors/quantization noise because errors in quantization noise in those sub signals reflect more on the overall signal x(t) than an error in other sub signals with lower power contributions to the signal x(t).

Accordingly, the bits per sample given to each sampled sub signal can be based on the relative contribution of a sub-signal to the overall signal x(t). And, based on how the bits per sample are assigned to the sub-signals, two advantages arise: 1. The overall number of bits per sample of x(t) can be reduced which reduces the overall bit rate for real-time processing; and 2. The quantization error observed in the reconstructed signal can be reduced in certain desired bands.

So, assuming each sub-signal is digitized at b bits per sample, the output bit rate (i.e., bits per second) is:

$$r_{b\ sub\text{-}signal}=\Delta f_{samples/second}\cdot b_{bits/sample}\cdot k_{number\ of\ sub\text{-}signals}.$$

Thus, the sum of the sub-signal bit rates is the same as sampling the overall signal x(t) at $f_s$ and assigning a general bit resolution to each sample if the sub signals were indeed assigned the same bit resolution. But, if one assumes that each sub-signal of x(t) contributes a total power of $P_1$ Watts to the original signal x(t), then the relative contribution of each sub signal to the original signal x(t) can be used to either reduce the total bit rate or improve the reconstructed signal quality by reducing the impact of quantization noise.

To achieve a bit rate reduction, each sub signal is assigned a number of bits per sample $b_i$ based on its relative contribution to the overall signal x(t) such that:

$$\Sigma_{i=1}^{k} b_i < k\cdot b.$$

Thus, one possible approach to assigning $b_i$ is to find an $x_i$ with the maximum $P_i$ ($x_{max}$ and $P_{max}$) and assign it b bits per sample. Then, the remaining $x_i$ sub-signals can be assigned $b_i$ according to:

$$b_i = \left\lfloor \frac{P_i}{P_{max}} \cdot b \right\rfloor.$$

The resulting values of $b_i$ should then satisfy $$\Sigma_{i=1}^{k} b_i < k\cdot b.$$

Alternatively, a threshold value S can be defined for $P_i$ that defines major contributing frequency bands to the overall signal x(t). Thus, $b_i$ can be algorithmically assigned according to:

$$\text{if } P_i \geq S \rightarrow b_i = b,$$

and $$\text{if } P_i < S \rightarrow b_i = \left\lfloor \frac{P_i}{P_{max}} \cdot b \right\rfloor.$$

The resulting values of $b_i$ should also then satisfy $$\Sigma_{i=1}^{k} b_i < k\cdot b.$$

To improve signal quality (e.g., by reducing the impact of quantization noise), each sub-signal is assigned its per sample $b_i$ based on the relative contribution to the overall signal x(t) such that $\Sigma_{i=1}^{k} b_i < k\cdot b$. In doing so, one might sort the $P_i$ values of the frequency bands in descending order and then find the median $P_i$ (i.e., $P_i=P_{i,\ median}$). From there, one could assign $b_i=b$ for $x_i$ that is associated with $P_{i,\ median}$. Then, one could choose a step size for $P_i$ in terms of order and for every step greater than $P_i$, and the associated $b_i$ is increased by j bits. And, for every step less than $P_i$, the associated $b_i$ is decreased by j bits.

An example of such is now presented using 11 sub-signals and a b value of 10 bits.

| $P_i$ | $P_4$ | $P_2$ | $P_{10}$ | $P_7$ | $P_9$ | $P_1$ | $P_3$ | $P_5$ | $P_8$ | $P_{11}$ | $P_6$ |
|---|---|---|---|---|---|---|---|---|---|---|---|
| $b_i$ | 13 | 12 | 12 | 11 | 11 | 10 median | 9 | 9 | 8 | 8 | 7 |

Now, assume that $P_4/P$ equals 32%, and $P_6/P$ equals 2%, and assuming a 10 volt P-P A/D design. Traditionally, the quantization error observed by the frequency bands $x_4$ and $x_6$ would be approximately 3 mV and the relative contributions would be 1.05 mV. Now, however, the quantization error observed by $x_4$ and $x_6$ would be about 0.35 mV and 22 mV, respectively, and the relative contribution would be about 0.55 mV.

As illustrated in FIG. 4, one possible manner in which the concepts herein may be implemented is the through the use of analog band pass filters 351. Alternatively, however, the process may be implemented in the digital domain as follows:

$$X(k) = \sum_{n=0}^{N-1} x(n)\cdot e^{\frac{-i2\pi nk}{N}};$$

and $$x(n) = \sum_{n=0}^{N-1} X(k)\cdot e^{\frac{i2\pi nk}{N}},$$

where $$x_I(n) = \sum_{k=k_{i,start}}^{k_{i,end}} X(k)\cdot e^{\frac{i2\pi nk}{N}},$$

Thus, to perform signal decomposition of the digital domain as a function of spectrum occupancy (i.e., the digital version of FIG. 4)

$$k = N\cdot\frac{f}{f_s}.$$

where the values of $k_{i,start}$ and $k_{i,end}$ are determined from $$k = N\cdot\frac{f}{f_s}.$$

The samples of $x_i(n)$ are then quantized with $b_i$ bids according to the targeted criteria as described above.

Figure 5:
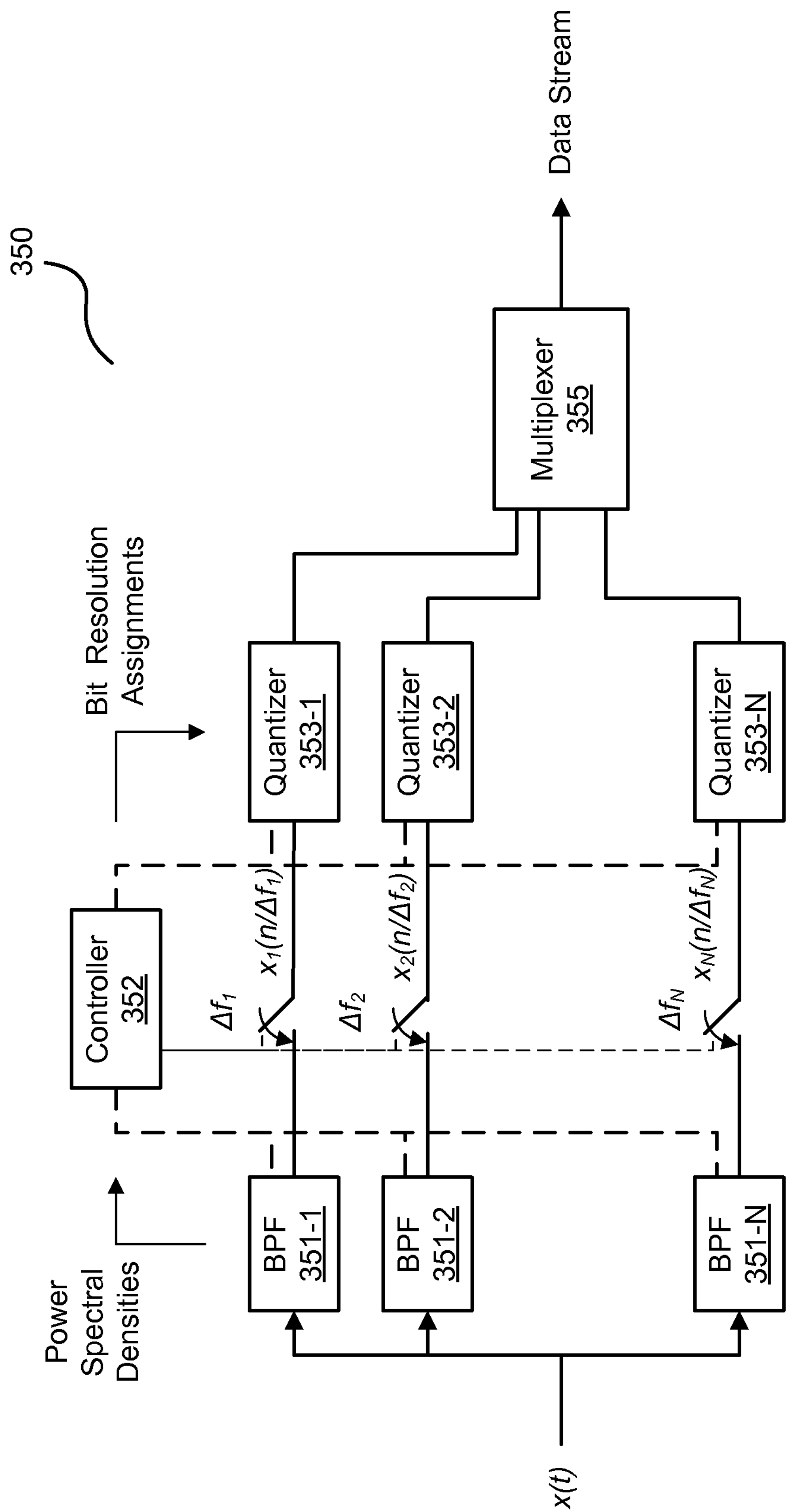
FIG. 5 is a block diagram of another exemplary A/D processing system.

FIG. 5 is a block diagram of another exemplary A/D processing system 350. In this embodiment, the controller 352 is also operable to control the sampling rates of the frequency bands (i.e., or sub-signals). This process may be implemented in addition to the selectively assigned bit resolutions discussed above. For example, assuming that a particular frequency band was contributing more to the overall signal x(t), then the controller 352, in addition to assigning a higher bit resolution to that frequency band, it would also direct the sampler to oversample that frequency band to improve resolution.

Figure 6:
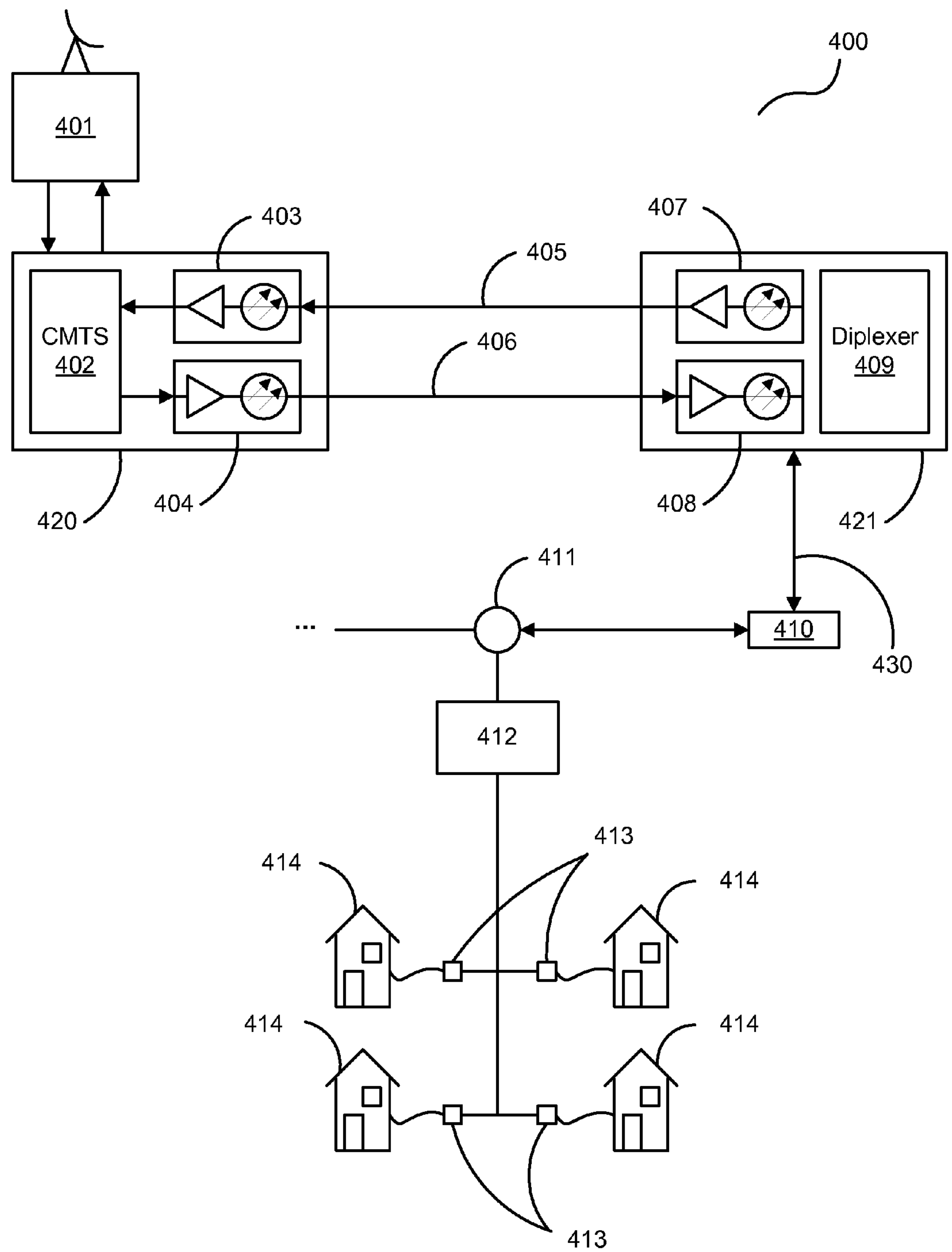
FIG. 6 is a block diagram of one exemplary communication system employing the A/D processing system.

FIG. 6 is a block diagram of an exemplary communication system 400 employing the A/D concepts described herein. For example, the A/D concepts disclosed herein may be implemented in a cable television communication system that employs RF signaling techniques across a substantial amount of RF spectrum. An upstream link of the cable television communication system, in this embodiment, provides high speed data services being delivered over devices conforming to the Data Over Cable Service Interface Specification (DOCSIS) specification. The communication system 400 includes a headend 401 configured with an upstream hub 420. The hub 420 is coupled to a downstream node 421 via optical communication links 405 and 406.

The hub 420 includes a Cable Modem Termination System (CMTS) 402, an electrical to optical converter 403, and an optical to electrical converter 404. The node 421 is similarly configured with an optical to electrical converter 408 and an electrical to optical converter 407. The A/D conversion concepts herein would generally be configured with the electrical to optical converters 403 and 407. Thus, digital to analog (D/A) operations would be performed by the optical to electrical converters 404 and 408 where the sampled/quantized/multiplexed sub-signals of previously analog x(t) signals are received.

To ensure that the sub-signals are properly converted, the D/A operations may be configured with demultiplexers that extract the sub signals from the overall datastream. To do so, the demultiplexer may require information pertaining to the exact structure of the datastream. For example, with one sub-signal having a bit rate of 100 Mbps and another sub-signal having a bit rate of 200 Mbps, then the overall bit rate of the datastream is 300 Mbps with one bit of the 100 Mbps sub-signal being interleaved with every two bits of the 200 Mbps sub-signal. As there may be several more frequency bands and a variety of bit resolutions/sub-signal bit rates, the multiplexed datastream can rapidly increase in complexity. Accordingly, a signaling technique using extra bits within the data stream may be used to flag the demultiplexer in the optical to electrical converters 404 and 408 and indicate which bit belongs to which sub-signal. However, such an implementation is a matter of design choice. It should also be noted that such design choices may include the use of extra bits in the datastream for error correction and other data transmission features (e.g., specific communication protocols, etc.).

With respect to the remaining features of FIG. 6, the headend 401 is generally the source for various television signals. Antennas may receive television signals that are converted as necessary and transmitted over fiber optic cables 405 to the hub 420. Several hubs may be connected to a single headend 401 and the hub 420 may be connected to several nodes 421 by fiber optic cable links 405 and 406. The CMTS 402 may be configured in the headend 401 or in the hub 420. The fiber optic links 405 and 406 are typically driven by laser diodes, such as Fabry Perot and distributed feedback laser diodes.

Downstream, in homes/businesses are devices called the Cable Modems (CM; not shown). A CM acts as a host for an Internet Protocol (IP) device such as personal computer. Transmissions from the CMTS 402 to the CM are carried over the downstream portion of the cable television communication system generally from 54 to 860 MHz. Downstream digital transmissions are continuous and are typically monitored by many CMs. Upstream transmissions from the CMs to the CMTS 402 are typically carried in the 5-42 MHz frequency band, the upstream bandwidth being shared by the CMs that are on-line. However, with greater demands for data, additional frequency bands and bandwidths are continuously being considered and tested, including those frequency bands used in the downstream paths.

The CMTS 402 connects the local CM network to the Internet backbone. The CMTS 402 connects to the downstream path through the electrical to optical converter 404 that is connected to the fiber optic cable 406, which in turn, is connected to the optical to electrical converter 408 at the node 421. The signal is transmitted to a diplexer 409 that combines the upstream and downstream signals onto a single cable. The diplexer 409 allows the different frequency bands to be combined onto the same cable. The downstream channel width in the United States is generally 6 megahertz with the downstream signals being transmitted in the 54 to 860 MHz band. Upstream signals are presently transmitted between 5 and 42 MHz, but again other larger bands are being considered to provide increased capacity. So, the variably assigned bit resolution concepts herein may be particularly advantageous. However, the invention is not intended to be limited to any particular form of communication system.

After the downstream signal leaves the node 421, the signal is typically carried by a coaxial cable 430. At various stages, a power inserter 410 may be used to power the coaxial line equipment, such as amplifiers or other equipment. The signal may be split with a splitter 411 to branch the signal. Further, at various locations, bi-directional amplifiers 412 may boost and even split the signal. Taps 413 along branches provide connections to subscriber's homes 414 and businesses.

Upstream transmissions from subscribers to the hub 420/headend 401 occur by passing through the same coaxial cable 430 as the downstream signals, in the opposite direction on a different frequency band. The upstream signals are sent typically utilizing Quadrature Amplitude Modulation (QAM) with forward error correction. The upstream signals can employ any level of QAM, including 8 QAM, 32 QAM, 64 QAM, 128 QAM, and 256 QAM. Modulation techniques such as Synchronous Code Division Multiple Access (S-CDMA) and Orthogonal Frequency Division Multiple Access (OFDMA) can also be used. Of course, any type of modulation technique can be used, as desired.

Transmissions, in this embodiment, are typically sent in a frequency/time division multiplexing access (FDMA/TDMA) scheme, as specified in the DOCSIS standards. The diplexer 409 splits the lower frequency signals from the higher frequency signals so that the lower frequency, upstream signals can be applied to the electrical to optical converter 407 in the upstream path. The electrical to optical converter 407 converts the upstream electrical signals to light waves which are sent through fiber optic cable 405 and received by optical to electrical converter 403 in the node 420.

Those skilled in the art should readily recognize that the invention is not intended to be limited to the examples disclosed herein. For example, the invention should not be limited to any particular number of frequency bands segmented, any number of bits of resolution during quantization, and/or any frequency bandwidth of an analog signal. Nor should the invention be limited to any particular form of analog signal. That is, the inventive concepts disclosed herein may be used in a variety of communication systems regardless of bandwidth considerations.

Figure 7:
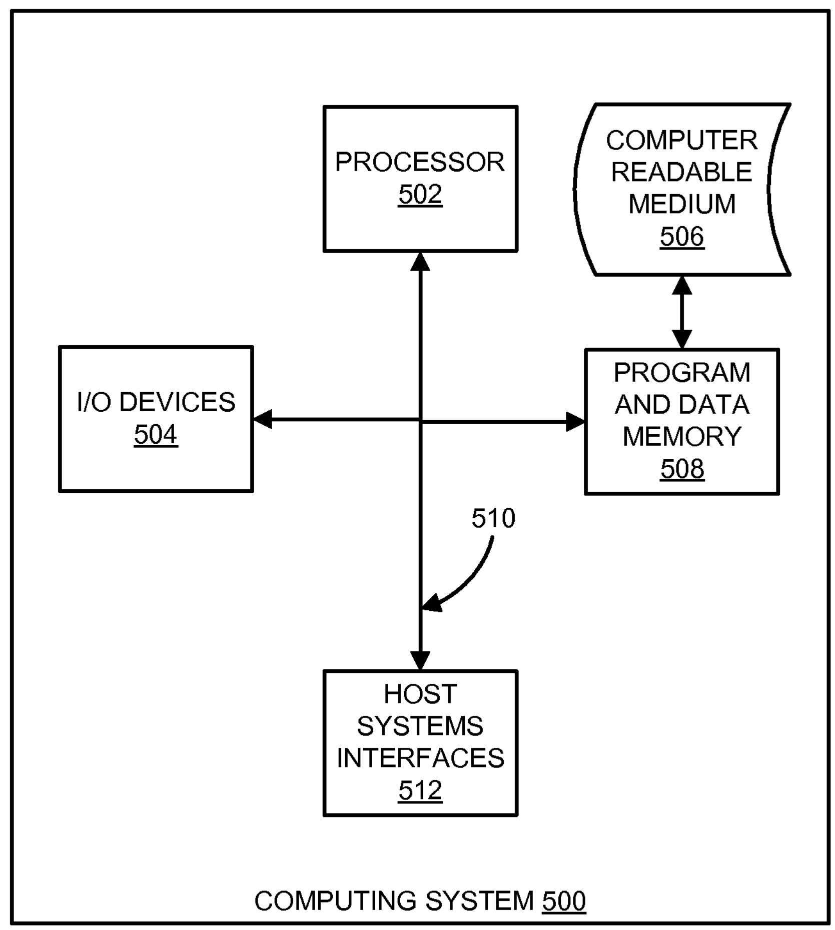
FIG. 7 is a block diagram of an exemplary computing system in which a computer readable medium provides instructions for performing methods herein.

Additionally, the invention can take the form of an entirely hardware embodiment, an entirely software embodiment or an embodiment containing both hardware and software elements. In one embodiment, the invention is implemented in software, which includes but is not limited to firmware, resident software, microcode, etc. FIG. 7 illustrates a computing system 500 in which a computer readable medium 506 may provide instructions for performing any of the methods disclosed herein.

Furthermore, the invention can take the form of a computer program product accessible from the computer readable medium 506 providing program code for use by or in connection with a computer or any instruction execution system. For the purposes of this description, the computer readable medium 506 can be any apparatus that can tangibly store the program for use by or in connection with the instruction execution system, apparatus, or device, including the computer system 500.

The medium 506 can be any tangible electronic, magnetic, optical, electromagnetic, infrared, or semiconductor system (or apparatus or device). Examples of a computer readable medium 506 include a semiconductor or solid state memory, magnetic tape, a removable computer diskette, a random access memory (RAM), a read-only memory (ROM), a rigid magnetic disk and an optical disk. Some examples of optical disks include compact disk-read only memory (CD-ROM), compact disk-read/write (CD-R/W) and DVD.

The computing system 500, suitable for storing and/or executing program code, can include one or more processors 502 coupled directly or indirectly to memory 508 through a system bus 510. The memory 508 can include local memory employed during actual execution of the program code, bulk storage, and cache memories which provide temporary storage of at least some program code in order to reduce the number of times code is retrieved from bulk storage during execution. Input/output or I/O devices 504 (including but not limited to keyboards, displays, pointing devices, etc.) can be coupled to the system either directly or through intervening I/O controllers. Network adapters may also be coupled to the system to enable the computing system 500 to become coupled to other data processing systems, such as through host systems interfaces 512, or remote printers or storage devices through intervening private or public networks. Modems, cable modem and Ethernet cards are just a few of the currently available types of network adapters.

What is claimed is:

1. A system, comprising:

a processor operable to receive an analog signal, to detect power spectral densities in the analog signal, to segment the analog signal into at least two frequency bands, to sample each of the frequency bands, and to quantize each of the sampled frequency bands with bit resolutions according to detected power spectral densities of the frequency bands; and a multiplexer operable to multiplex the quantized frequency bands into a data stream.

2. The system of claim 1, wherein:

the processor is further operable to assign a lower bit resolution to a first of the at least two frequency bands having a lower power spectral density to reduce the overall bit rate of the data stream.

3. The system of claim 1, wherein:

the processor is further operable to assign a higher bit resolution to a first of the at least two frequency bands having a higher power spectral density to improve a signal to noise ratio of the first frequency band.

4. The system of claim 1, wherein:

the processor comprises first and second bandpass filters operable to respectively segment the analog signal into first and second of the at least two frequency bands; and the processor is further operable to sample the first and second frequency bands at a first sampling rate, to quantize the first frequency band with a first number of bits per sample, and to quantize the second frequency band with a second number of bits per sample, wherein the first and second numbers of bits per sample are different.

5. The system of claim 1, wherein, for first and second of the at least two frequency bands:

a bit rate of a first frequency band is about a sampling rate of the first frequency band times a number of bits assigned per sample of the first frequency band;

a bit rate of a second frequency band is about a sampling rate of the second frequency band times a number of bits assigned per sample of the second frequency band; and a bit rate of the data stream is about the sum of the bit rate of a first frequency band and the bit rate of a second frequency band.

6. The system of claim 1, wherein, for first and second of the at least two frequency bands:

the processor is further operable to sample the first frequency band at a first sampling rate, to assign a first number of bits to each sample of the first frequency band, to sample the second frequency band at a second sampling rate, and to assign a first number of bits to each sample of the second frequency band.

7. The system of claim 1, further comprising:

a digital signal processor operable to receive the data stream, to demultiplex the data stream into separate substreams according to the bit resolutions, and to convert the substreams into another analog signal having a total bandwidth corresponding to a sum of the at least two frequency bands.

8. A method, comprising:

processing an analog signal;

detecting power spectral densities in the analog signal;

segmenting the analog signal into at least two frequency bands;

sampling each of the frequency bands;

quantizing each of the sampled frequency bands with bit resolutions according detected power spectral densities of the frequency bands; and multiplexing the quantized frequency bands into a data stream.

9. The method of claim 8, further comprising:

assigning a lower bit resolution to a first of the at least two frequency bands having a lower power spectral density to reduce the overall bit rate of the data stream.

10. The method of claim 8, further comprising:

assigning a higher bit resolution to a first of the at least two frequency bands having a higher power spectral density to improve a signal to noise ratio of the first frequency band.

11. The method of claim 8, further comprising:

bandpass filtering the analog signal to segment the analog signal into first and second of the at least two frequency bands;

sampling the first and second frequency bands at a first sampling rate;

quantizing the first frequency band with a first number of bits per sample; and quantizing the second frequency band with a second number of bits per sample, wherein the first and second numbers of bits per sample are different.

12. The method of claim 8, wherein, for first and second of the at least two frequency bands:

a bit rate of a first frequency band is about a sampling rate of the first frequency band times a number of bits assigned per sample of the first frequency band;

a bit rate of a second frequency band is about a sampling rate of the second frequency band times a number of bits assigned per sample of the second frequency band; and a bit rate of the data stream is about the sum of the bit rate of a first frequency band and the bit rate of a second frequency band.

13. The method of claim 8, further comprising, for first and second of the at least two frequency bands:

sampling the first frequency band at a first sampling rate;

assigning a first number of bits to each sample of the first frequency band;

sampling the second frequency band at a second sampling rate; and assigning a first number of bits to each sample of the second frequency band.

14. The method of claim 8, further comprising:

processing the data stream;

demultiplexing the data stream into separate substreams according to the bit resolutions; and converting the substreams into another analog signal having a total bandwidth corresponding to a sum of the at least two frequency bands.

15. A non-transitory computer readable medium comprising instructions that, when executed by a processor, direct the processor to:

process an analog signal;

detect power spectral densities in the analog signal;

segment the analog signal into at least two frequency bands;

sample each of the frequency bands;

quantize each of the sampled frequency bands with bit resolutions according detected power spectral densities of the frequency bands; and multiplex the quantized frequency bands into a data stream.

16. The computer readable medium of claim 15, further comprising instructions that direct the processor to:

assign a lower bit resolution to a first of the at least two frequency bands having a lower power spectral density to reduce the overall bit rate of the data stream.

17. The computer readable medium of claim 15, further comprising instructions that direct the processor to:

assign a higher bit resolution to a first of the at least two frequency bands having a higher power spectral density to improve a signal to noise ratio of the first frequency band.

18. The computer readable medium of claim 15, further comprising instructions that direct the processor to:

bandpass filter the analog signal to segment the analog signal into first and second of the at least two frequency bands;

sample the first and second frequency bands at a first sampling rate;

quantize the first frequency band with a first number of bits per sample; and quantize the second frequency band with a second number of bits per sample, wherein the first and second numbers of bits per sample are different.

19. The computer readable medium of claim 15, wherein, for first and second of the at least two frequency bands:

a bit rate of a first frequency band is about a sampling rate of the first frequency band times a number of bits assigned per sample of the first frequency band;

a bit rate of a second frequency band is about a sampling rate of the second frequency band times a number of bits assigned per sample of the second frequency band; and a bit rate of the data stream is about the sum of the bit rate of a first frequency band and the bit rate of a second frequency band.

20. The computer readable medium of claim 15, further comprising instructions that direct the processor to, for first and second of the at least two frequency bands:

sample the first frequency band at a first sampling rate;

assign a first number of bits to each sample of the first frequency band;

sample the second frequency band at a second sampling rate; and assign a first number of bits to each sample of the second frequency band.

* * * * *